United States Patent
Kim et al.

(10) Patent No.: US 11,156,550 B2
(45) Date of Patent: Oct. 26, 2021

(54) TERAHERTZ-WAVE DETECTOR AND TERAHERTZ UNIT

(71) Applicant: ROHM CO., LTD., Kyoto (JP)

(72) Inventors: Jaeyoung Kim, Kyoto (JP); Toshikazu Mukai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/642,668

(22) PCT Filed: Aug. 3, 2018

(86) PCT No.: PCT/JP2018/029154
§ 371 (c)(1),
(2) Date: Feb. 27, 2020

(87) PCT Pub. No.: WO2019/044375
PCT Pub. Date: Mar. 7, 2019

(65) Prior Publication Data
US 2020/0200677 A1    Jun. 25, 2020

(30) Foreign Application Priority Data

Aug. 31, 2017 (JP) .............................. JP2017-167159

(51) Int. Cl.
| | | |
|---|---|---|
| G01N 21/3581 | (2014.01) | |
| G01R 31/28 | (2006.01) | |
| H03B 7/06 | (2006.01) | |
| H01Q 23/00 | (2006.01) | |
| H03C 7/00 | (2006.01) | |
| H01Q 1/22 | (2006.01) | |
| H01S 1/02 | (2006.01) | |
| H01L 31/08 | (2006.01) | |
| H03B 7/08 | (2006.01) | |
| H03B 7/00 | (2006.01) | |

(Continued)

(52) U.S. Cl.
CPC ..... *G01N 21/3581* (2013.01); *G01R 31/2831* (2013.01); *H01L 31/08* (2013.01); *H01Q 1/2283* (2013.01); *H01Q 9/24* (2013.01); *H01Q 23/00* (2013.01); *H01S 1/02* (2013.01); *H03B 7/00* (2013.01); *H03B 7/06* (2013.01); *H03B 7/08* (2013.01); *H03C 7/00* (2013.01); *H03C 7/025* (2013.01); *G02F 2203/13* (2013.01); *H03B 2200/0084* (2013.01)

(58) Field of Classification Search
CPC ...... H01L 31/08; H01Q 23/00; H01Q 1/2283; H01Q 9/24; H03B 2200/0084; H03B 7/06; H03B 7/00; H03B 7/08; G01N 21/3581; G01R 31/28; H03C 7/02
USPC ............ 331/107 DP, 116 R, 107 T; 324/633, 324/629, 639
See application file for complete search history.

(56) References Cited

U.S. PATENT DOCUMENTS

2017/0271774 A1    9/2017 Mukai et al.

FOREIGN PATENT DOCUMENTS

| JP | 2007-124250 A | 5/2007 |
|---|---|---|
| JP | 2013-005115 A | 1/2013 |

(Continued)

*Primary Examiner* — Arnold M Kinkead
(74) *Attorney, Agent, or Firm* — Rabin & Berdo, P.C.

(57) ABSTRACT

One aspect of the present disclosure provides a terahertz-wave detector including a semiconductor substrate, an active element formed on the semiconductor substrate and a first resistive portion electrically connected in parallel with the active element.

14 Claims, 23 Drawing Sheets

(51) Int. Cl.
*H01Q 9/24* (2006.01)
*H03C 7/02* (2006.01)

(56) References Cited

FOREIGN PATENT DOCUMENTS

| | | |
|---|---|---|
| JP | 2016-111542 A | 6/2016 |
| WO | 2016/092886 A1 | 6/2016 |
| WO | WO-2016203712 A1 * 12/2016 | ........... H01Q 9/0442 |

* cited by examiner

FIG.4
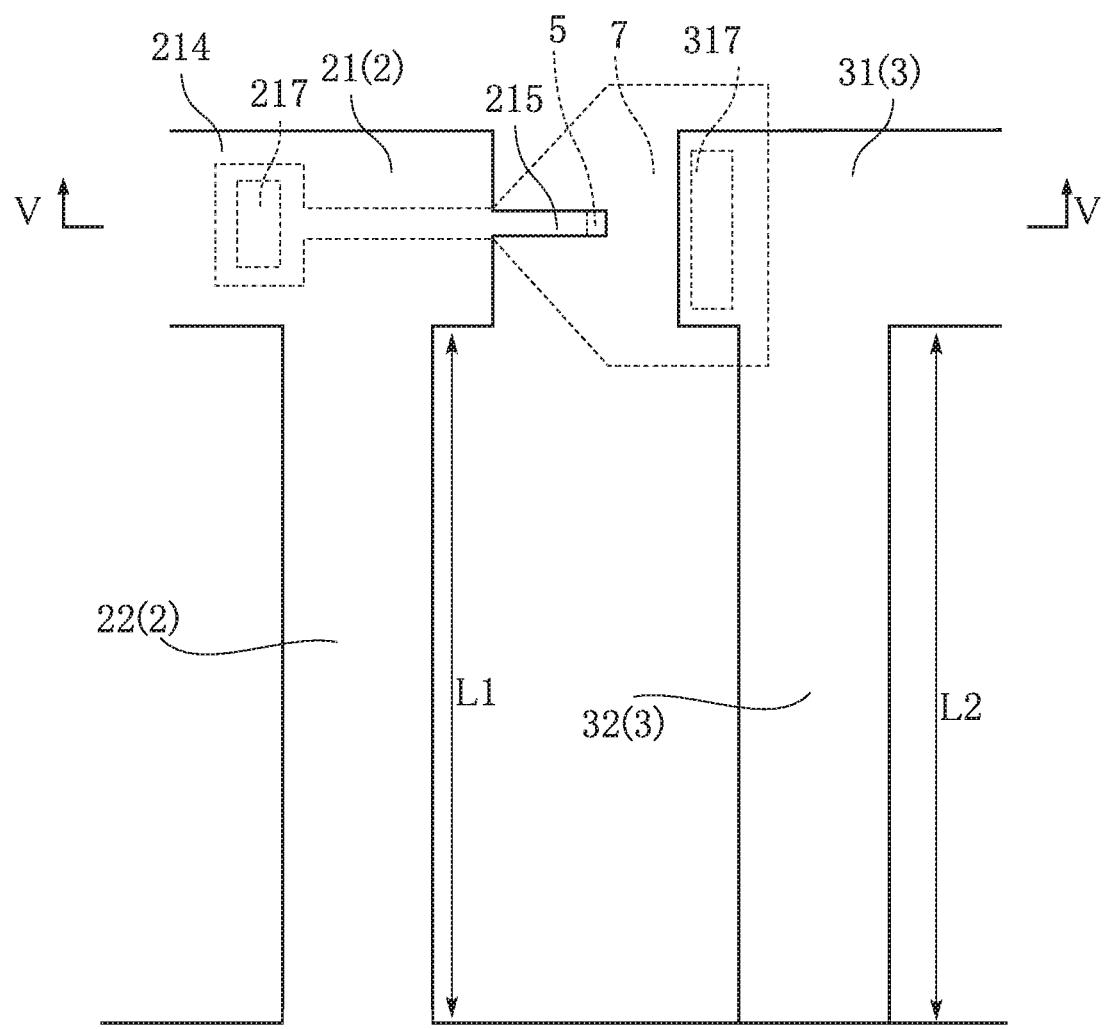
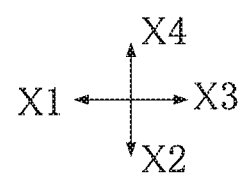

FIG.9
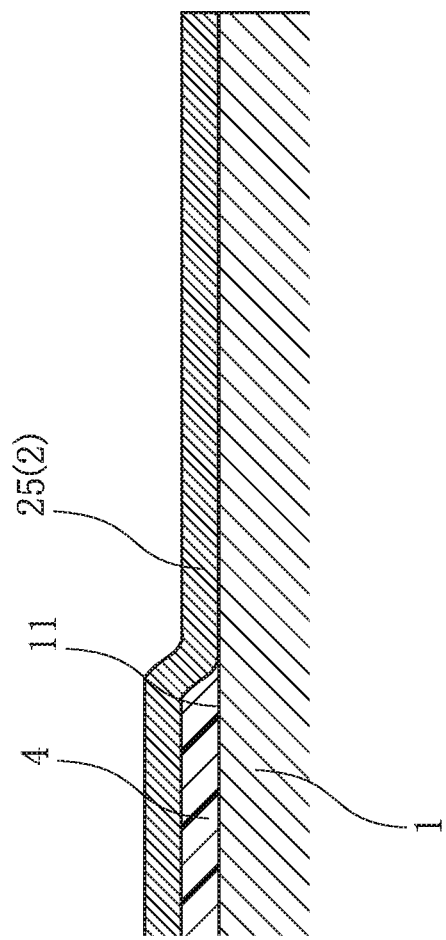
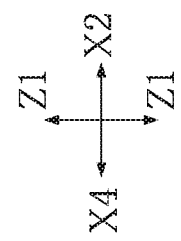

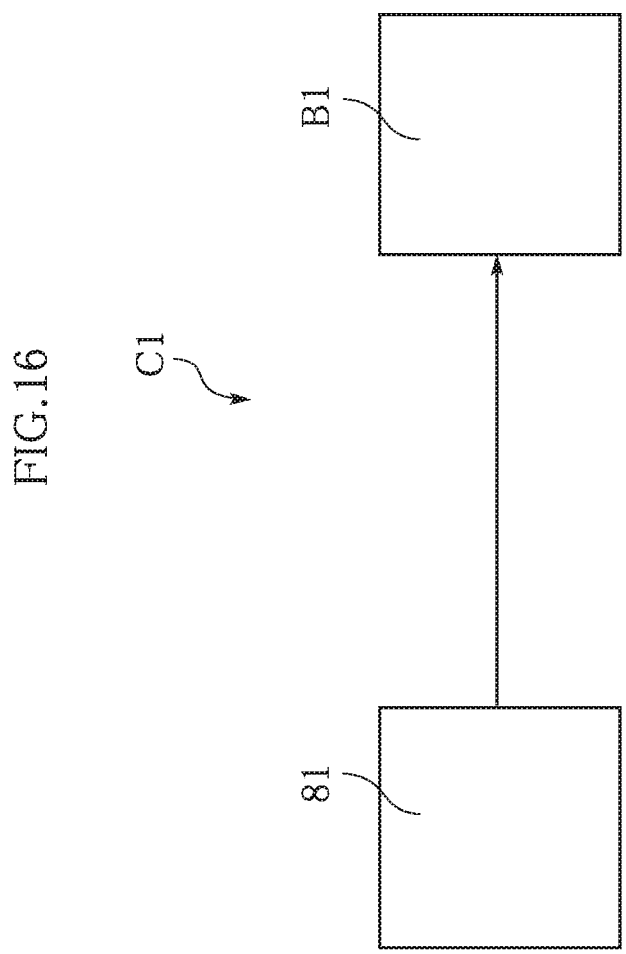

FIG.23
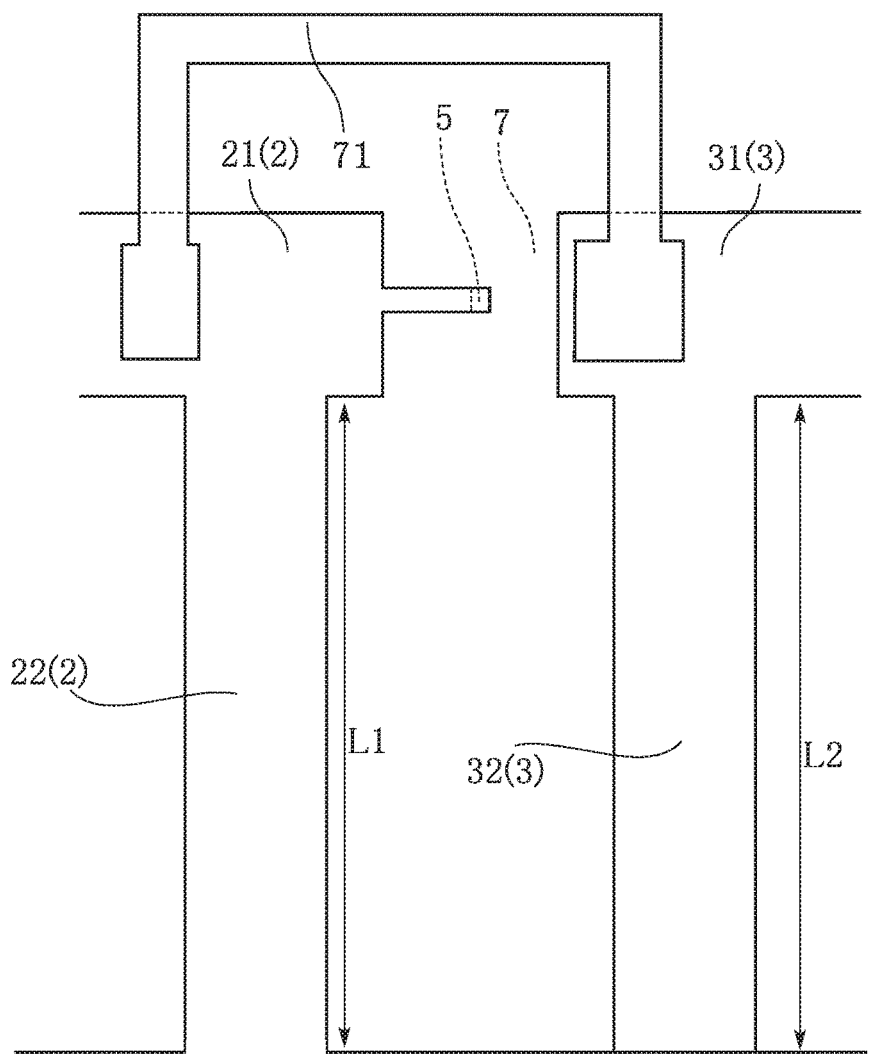
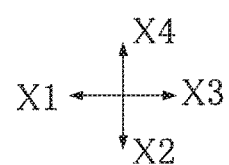

US 11,156,550 B2

TERAHERTZ-WAVE DETECTOR AND TERAHERTZ UNIT

TECHNICAL FIELD

The present disclosure relates to terahertz-wave detectors and terahertz units.

BACKGROUND ART

In recent years, miniaturization of electronic devices, such as transistors, has progressed, with the sizes of electronic devices being reduced to nano-scale. Consequently, phenomena called quantum effects have been frequently observed. Quantum effects may be used to provide superfast devices and new-function devices, and development of such devices is underway. One challenge involved in the development is to use the frequency range of 0.1 to 10 THz (terahertz frequency range) in the fields of, for example, communications, information processing of large capacity data, imaging, and measurement. The terahertz frequency range, which falls between light and radio waves, has yet to be explored. Devices operating in the terahertz range can be used in a number of applications. In addition to imaging, large capacity communications and information processing mentioned above, the potential applications include measurements in various fields, including physical property, astronomy and biology.

SUMMARY OF THE INVENTION

A first aspect of the present disclosure provides a terahertz-wave detector including a semiconductor substrate, an active element formed on the semiconductor substrate and a first resistive portion electrically connected in parallel with the active element.

A second aspect of the present disclosure provides a terahertz system including a terahertz oscillator that generates terahertz waves and the terahertz-wave detector according to the first aspect of the present disclosure. The terahertz-wave detector detects terahertz waves generated by the terahertz oscillator.

BRIEF DESCRIPTION OF THE DRAWINGS

FIG. 4 is a partially enlarged view of a region IV of FIG. 2.

FIG. 9 is a sectional view taken along line IX-IX of FIG. 2.

FIG. 16 is a block diagram showing a terahertz unit according to the first embodiment.

FIG. 23 is a plan view of a terahertz-wave detector according to a third variation of the first embodiment.

MODE FOR CARRYING OUT THE INVENTION

The following specifically describes embodiments of the present disclosure, with reference to the accompanying drawings.

First Embodiment

With reference to FIGS. 1 to 19B, a first embodiment of the present disclosure is described.

Figure 1:
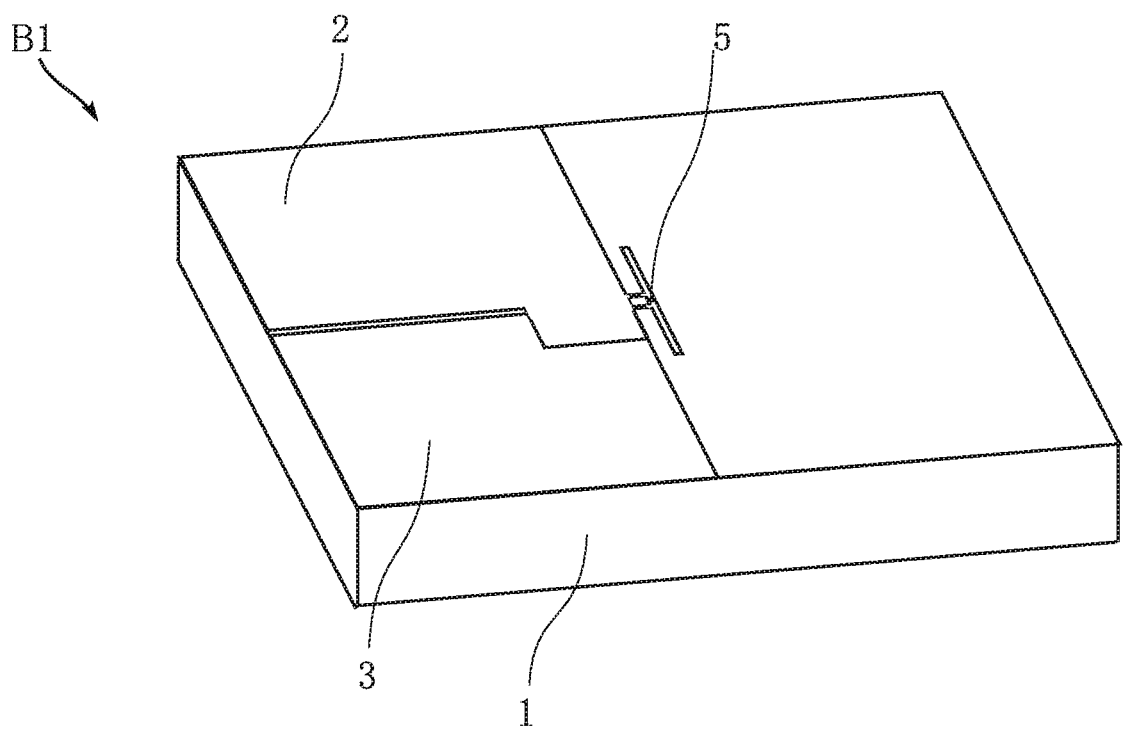
FIG. 1 is a perspective view of a terahertz-wave detector according to a first embodiment.
Figure 2:
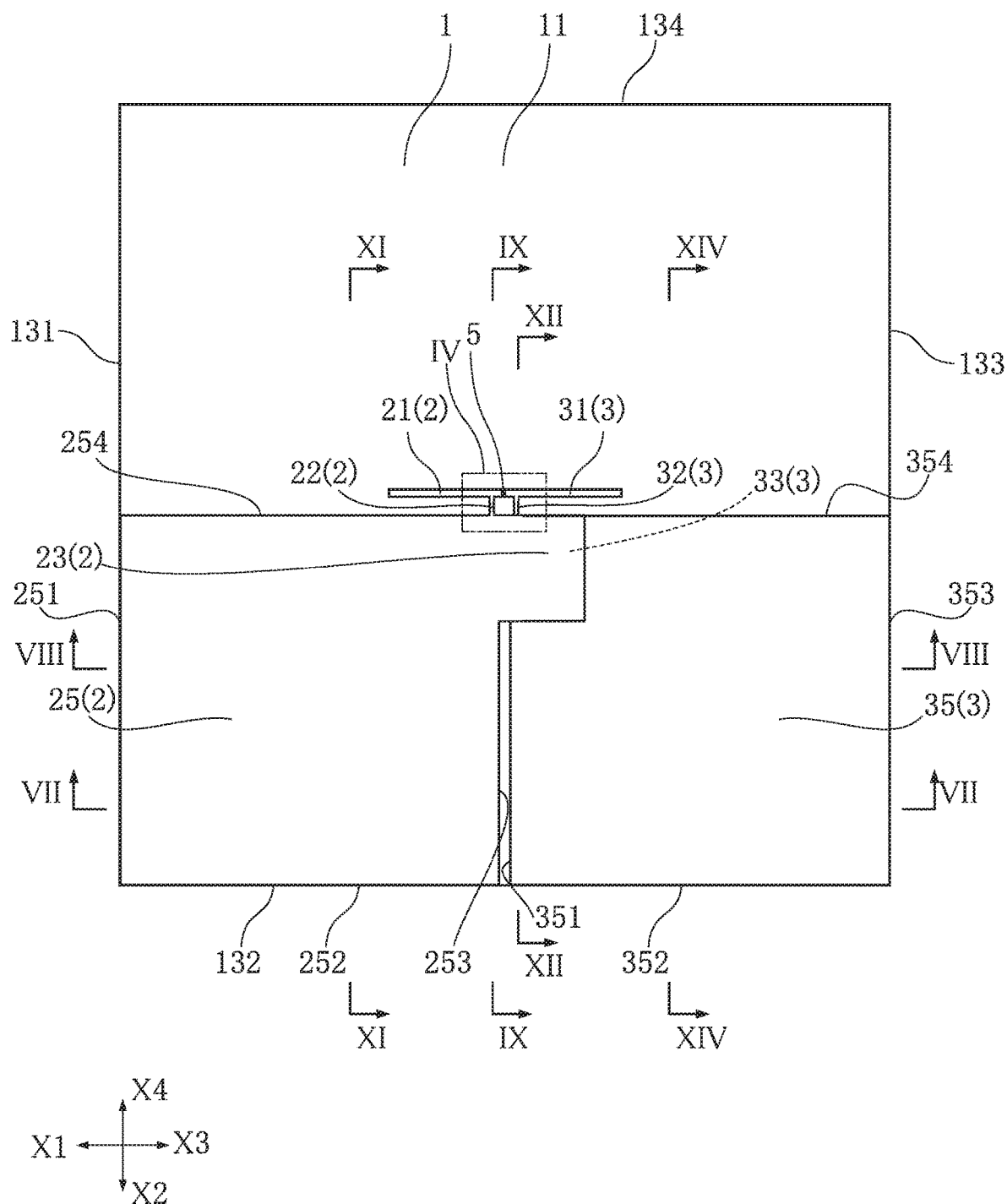
FIG. 2 is a plan view of the terahertz-wave detector according to the first embodiment.

FIG. 1 is a perspective view of a terahertz-wave detector according to the first embodiment. FIG. 2 is a plan view of the terahertz-wave detector according to the first embodiment.

The terahertz-wave detector B1 shown in the figures detects electromagnetic waves in the terahertz frequency range (high frequency electromagnetic waves). The terahertz-wave detector B1 includes a semiconductor substrate 1, a first conductive layer 2, a second conductive layer 3, an insulating layer 4 (see e.g., FIG. 5), an active element 5 and a resistive layer 7 (see e.g., FIGS. 4 and 5).

The semiconductor substrate 1 is made of a semiconductor and is semi-insulating. For example, the semiconductor substrate 1 may be made of InP. The semiconductor substrate 1 has a surface 11. The surface 11 faces in a thickness direction Z1 of the semiconductor substrate 1 (see e.g., FIG. 5).

As shown in FIG. 2, the semiconductor substrate 1 has edges 131 to 134. The edges 131 and 133 are spaced apart from each other in a first direction X1. The edges 131 and 133 extend in a second direction X2. The second direction X2 is perpendicular to the first direction X1. The edges 132 and 134 are spaced apart from each other in the second direction X2. The edges 132 and 134 extend in the first direction X1. The edge 131 is physically connected to the edges 132, the edge 132 is physically connected to the edge 133, the edge 133 is physically connected to the edge 134, and the edge 134 is physically connected to the edge 131.

Figure 5:
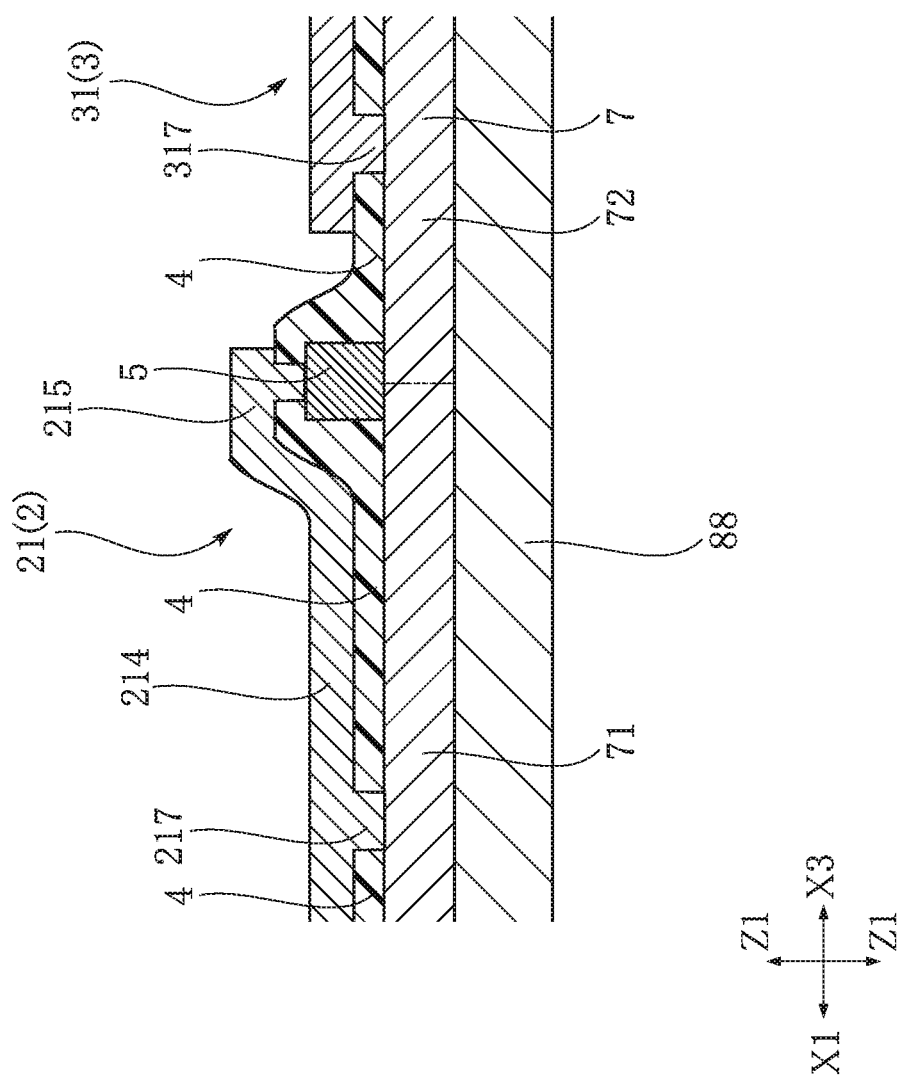
FIG. 5 is a sectional view taken along line V-V of FIG. 4.

FIG. 4 is a partially enlarged view of the region IV of FIG. 2. FIG. 5 is a sectional view taken along line V-V of FIG. 4. As shown in the figures, the resistive layer 7 is disposed on the semiconductor substrate 1. The resistive layer 7 is physically interposed between the active element 5 and the semiconductor substrate 1. The resistive layer 7 overlaps with the active element 5 as viewed in the thickness direction Z1 of the semiconductor substrate 1. The resistive layer 7 may be made of GaInAs as described above. The resistive layer 7 may be doped with an n-type impurity at a high concentration. Details of the resistive layer 7 will be described later.

The active element 5 shown in FIGS. 2 and 4 is formed on the semiconductor substrate 1. The active element 5 is electrically connected to the first conductive layer 2 and the second conductive layer 3. The active element 5 is formed on the resistive layer 7. The resistive layer 7 has a first resistive portion 71 (see FIG. 17B and described later), without which the active element 5 would emit electromagnetic waves, and these waves would be reflected by a back-surface reflective metal layer 88, forming a surface-emitting radiation pattern in the direction perpendicular to the semiconductor substrate 1 (thickness direction Z1). In the present embodiment, however, due to the presence of the first resistive portion 71 (described later), the active element 5 does not emit electromagnetic waves.

In one example, the active element 5 is a resonant tunneling diode (RTD). Alternatively, the active element 5 may be a diode or transistor other than RTD. Examples of the active element 5 include a tunnel transit time (TUNNETT) diode, an impact ionization avalanche transit time (IMPATT) diode, a GaAs-based field effect transistor (FET), a GaN-based FET, a high electron mobility transistor (HEMT), and a heterojunction bipolar transistor (HBT).

One implementation of the active element 5 is described with reference to FIG. 6. A GaInAs layer 92 is disposed on the resistive layer 7 and doped with an n-type impurity. A GaInAs layer 93a is disposed on the GaInAs 92a and undoped. An AlAs 94a is disposed on the GaInAs layer 93a, an InGaAs layer 95 is disposed on the AlAs 94a, and an AlAs layer 94b is disposed on the InGaAs layer 95. The AlAs layer 94a, the InGaAs layer 95 and the AlAs layer 94b may form an RTD unit. A GaInAs layer 93b is disposed on the AlAs layer 94b and undoped. A GaInAs layer 92b is disposed on the GaInAs layer 93b and doped with an n-type impurity. A GaInAs layer 91b is disposed on the GaInAs layer 92b and doped with an n-type impurity at a high concentration. The first conductive layer 2 is disposed on the GaInAs layer 91b.

Figure 6:
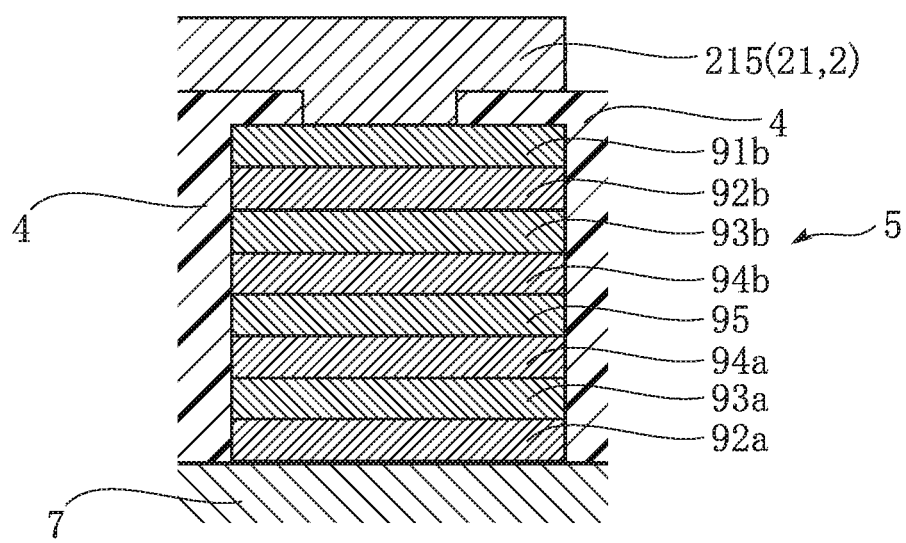
FIG. 6 is a partially enlarged view of FIG. 5.
Figure 7:
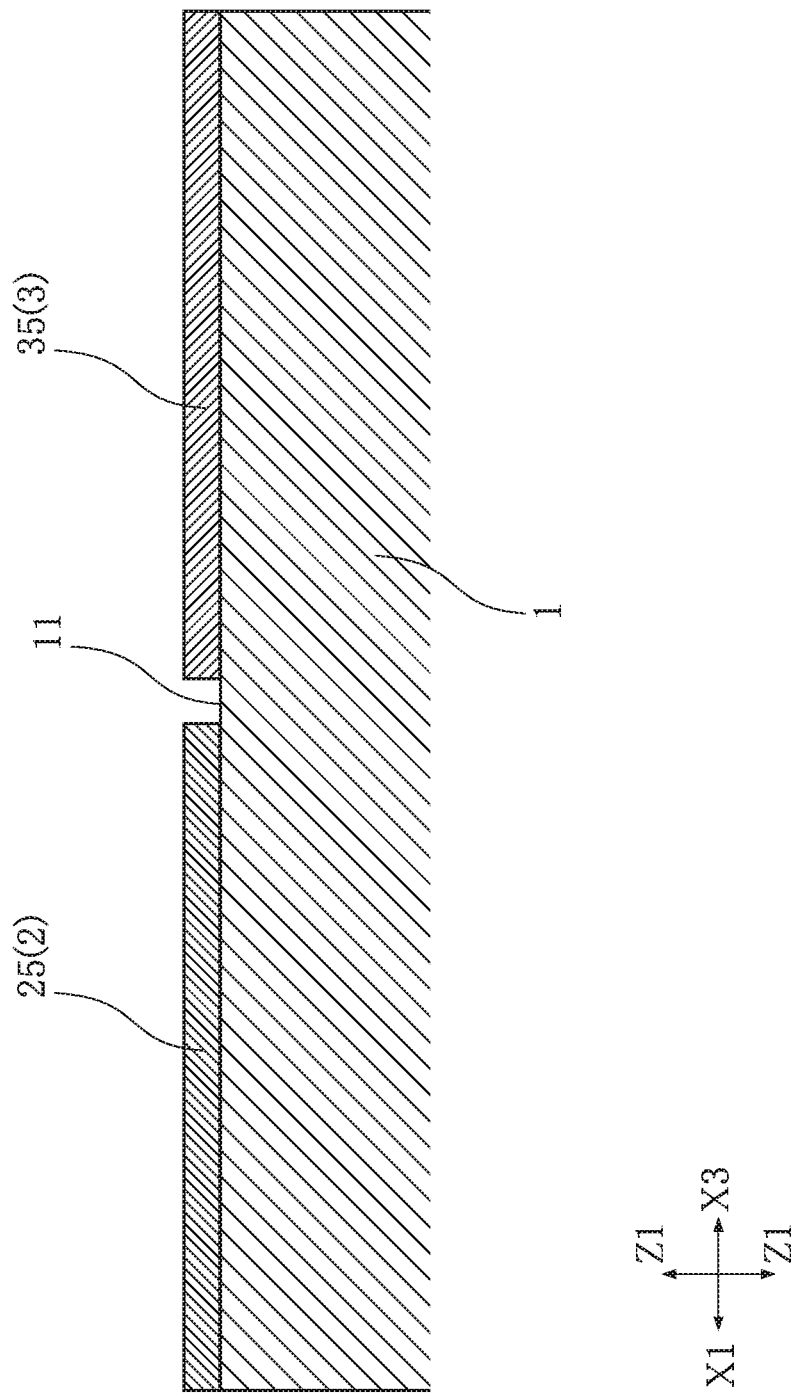
FIG. 7 is a sectional view taken along line VII-VII of FIG. 2.
Figure 8:
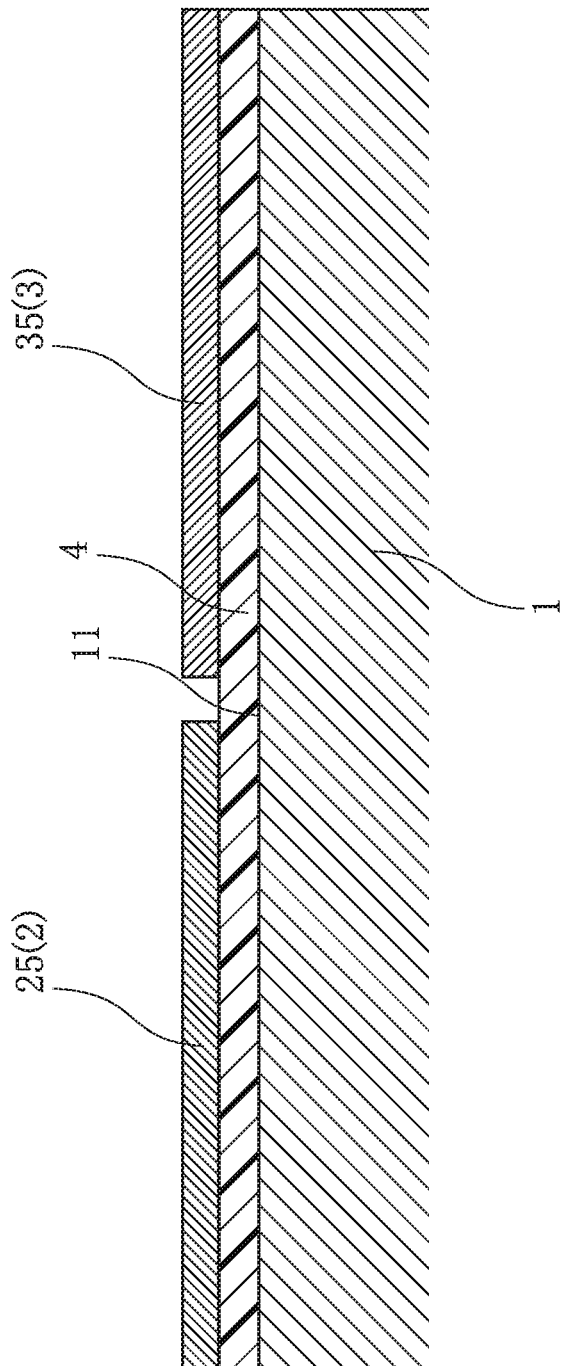
FIG. 8 is a sectional view taken along line VIII-VIII of FIG. 2.
Figure 10:
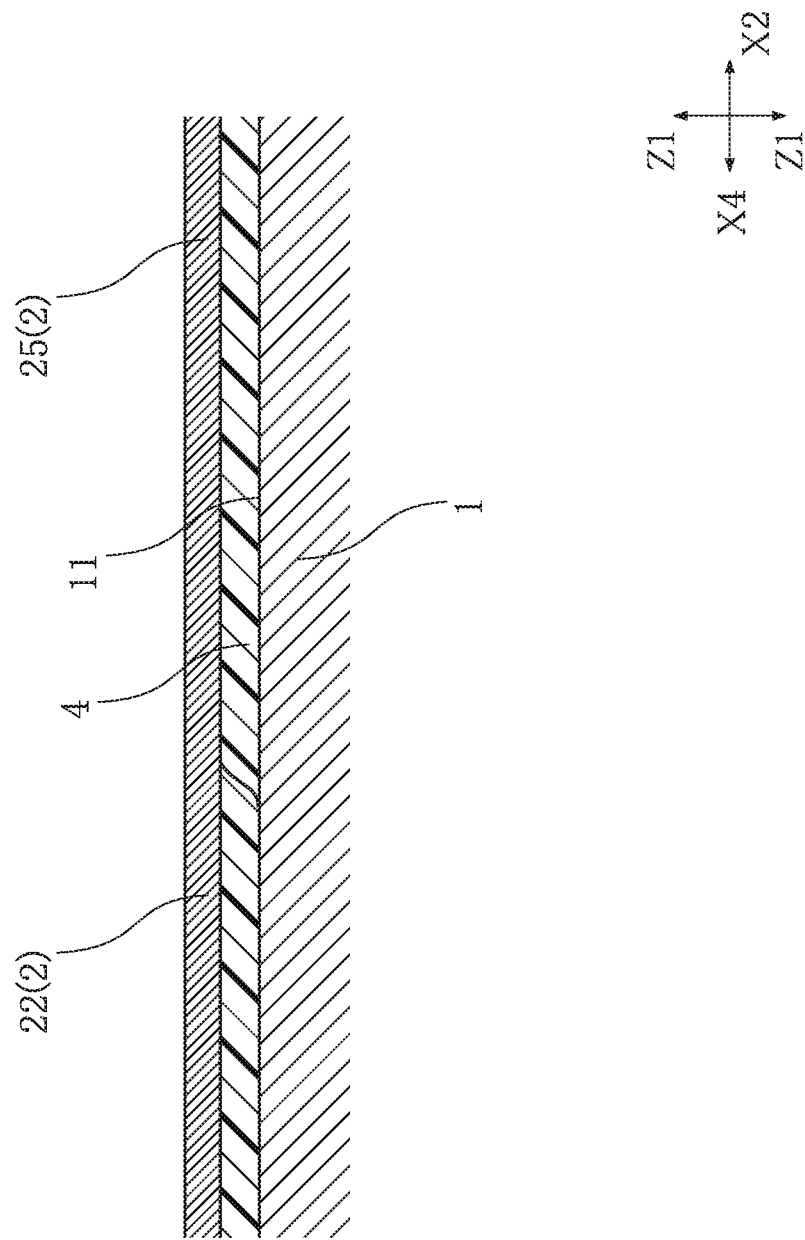
FIG. 10 is another sectional view taken along line IX-IX of FIG. 2.

Unlike the configuration shown in FIG. 6, an additional GaInAs layer (although not illustrated) doped with an n-type impurity at a high concentration may be included between the GaInAs layer 91b and the first conductive layer 2. This configuration can enhance the contact between the first conductive layer 2 and the GaInAs layer 91b.

The insulating layer 4 shown in, for example, FIG. 5 is formed on the semiconductor substrate 1, specifically on the resistive layer 7 in this embodiment. The insulating layer 4 covers the sides of the active element 5. The insulating layer 4 may be made of $SiO_2$, for example. Alternatively, the insulating layer 4 may be made of $Si_3N_4$, SiON, $HfO_2$ or $Al_2O_3$. The insulating layer 4 may have a thickness of 10 to 1,000 nm, for example. The insulating layer 4 may be formed by CVD or sputtering.

As shown, for example, in FIG. 2, the first conductive layer 2 and the second conductive layer 3 are formed on the semiconductor substrate 1. The first conductive layer 2 and the second conductive layer 3 are insulated from each other. As viewed in the thickness direction Z1 of the semiconductor substrate 1, the active element 5 is spaced apart from the second conductive layer 3 in the first direction X1 perpendicular to the thickness direction Z1 of the semiconductor substrate 1. Each of the first conductive layer 2 and the second conductive layer 3 is a laminate of metal layers. In one example, each of the first conductive layer 2 and the second conductive layer 3 is a laminate of Au, Pd and Ti. Alternatively, each of the first conductive layer 2 and the second conductive layer 3 may be a laminate of Au and Ti. The first conductive layer 2 and the second conductive layer 3 have a thickness of about 10 to 200 nm, for example. The first conductive layer 2 and the second conductive layer 3 may be formed by vacuum vapor deposition or sputtering.

The first conductive layer 2 includes a first portion 21, a first inductance portion 22, a first capacitor portion 23 and a first electrode 25. The second conductive layer 3 includes a second portion 31, a second inductance portion 32, a second capacitor portion 33 and a second electrode 35.

The first portion 21 shown in FIGS. 2, 4 and 5 extends in the first direction X1. The first portion 21 includes a first conductive portion 214, a second conductive portion 215 and a first contact portion 217.

In FIGS. 2 and 4, the first conductive portion 214 is rectangular. The first conductive portion 214 may function as an antenna. As viewed in the thickness direction Z1, the second conductive portion 215 extends from the first conductive portion 214 toward the second conductive layer 3. As viewed in the thickness direction Z1, the second conductive portion 215 overlaps with the active element 5. In the present embodiment, the entire second conductive portion 215 overlaps with the resistive layer 7 as viewed in the thickness direction Z1 of the substrate. In the example shown in FIG. 5, the first contact portion 217 is formed in a hole of the insulating layer 4. The first contact portion 217 is physically connected to the first conductive portion 214. The first contact portion 217 is in contact with the resistive layer 7.

The first inductance portion 22 shown, for example, in FIGS. 2 and 4, is physically connected to the first portion 21 and the first capacitor portion 23, by extending from the first portion 21 to the first capacitor portion 23 in the second direction X2. The first inductance portion 22 may function as an inductance. The first inductance portion 22 has a length L1 of 5 to 100 μm in the second direction X2 (see FIG. 4). The first inductance portion 22 has a width of 1 to 10 μm, for example. As shown in FIG. 4, the first inductance portion 22 is spaced apart from the resistive layer 7 as viewed in the thickness direction Z1.

The second portion 31 extends in the third direction X3. The third direction X3 is opposite to the first direction X1. The second portion 31 may function as an antenna. The second inductance portion 32 is physically connected to the second portion 31 and the second capacitor portion 33, by extending from the second portion 31 to the second capacitor portion 33 in the second direction X2. The second inductance portion 32 may function as an inductance. The second inductance portion 32 has a length L2 of 5 to 100 μm in the second direction X2 (see FIG. 4). The second inductance portion 32 has a width of 1 to 10 μm, for example. The second portion 31 includes a second contact portion 317. As shown in FIG. 5, the second contact portion 317 of this embodiment is formed in a hole of the insulating layer 4. The second contact portion 317 is in contact with the resistive layer 7. As shown in FIG. 4, the second inductance portion 32 is spaced apart from the resistive layer 7 as viewed in the thickness direction Z1.

As shown, for example, in FIGS. 2 and 4, the first capacitor portion 23 is offset from the active element 5 in the second direction X2. In the present embodiment, the first capacitor portion 23 is rectangular as viewed in the thickness direction Z1.

Figure 3:
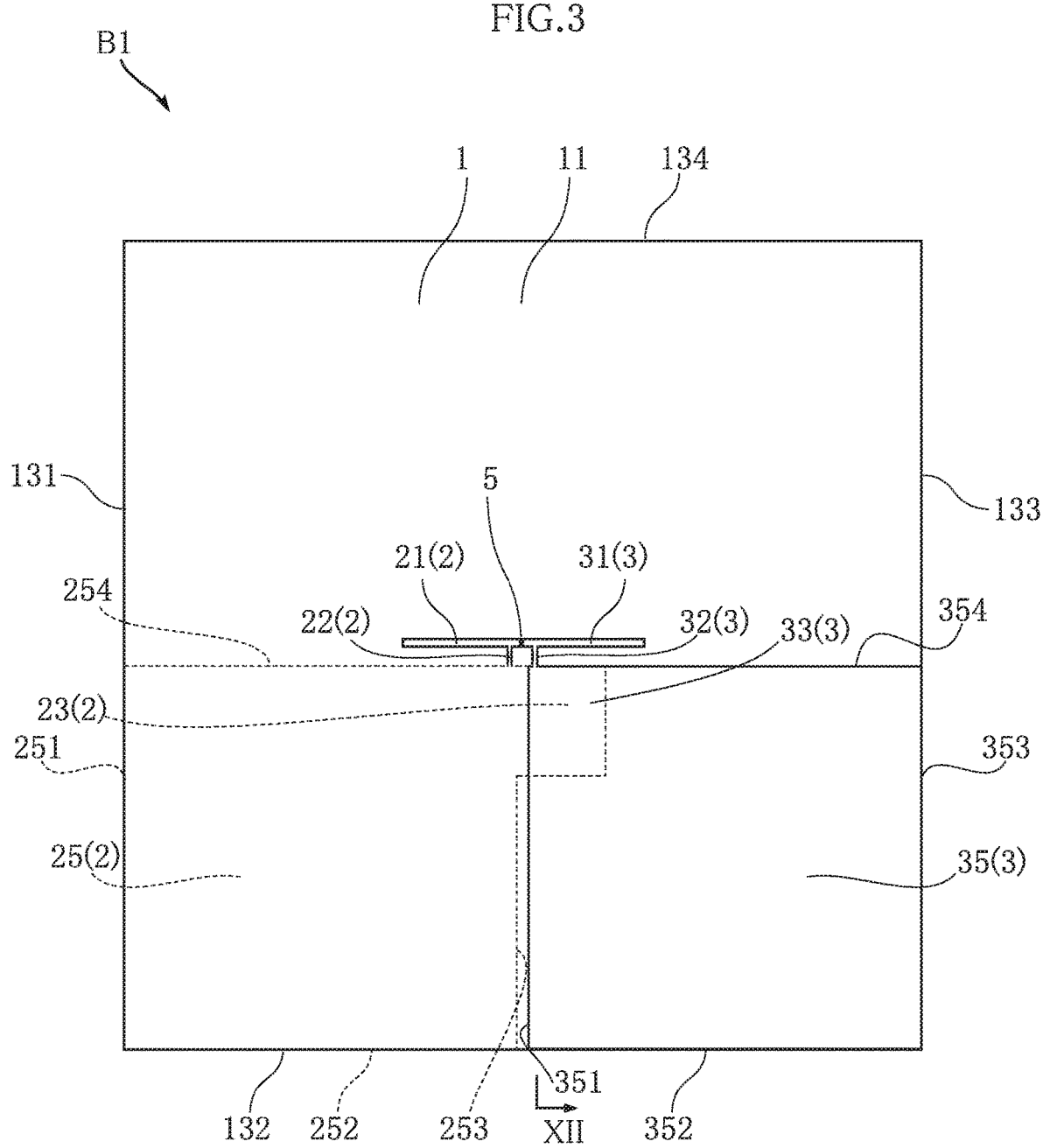
FIG. 3 corresponds to FIG. 2, but omitting a first conductive layer.

FIG. 3 corresponds to FIG. 2 but omitting the first conductive layer 2.

Figure 12:
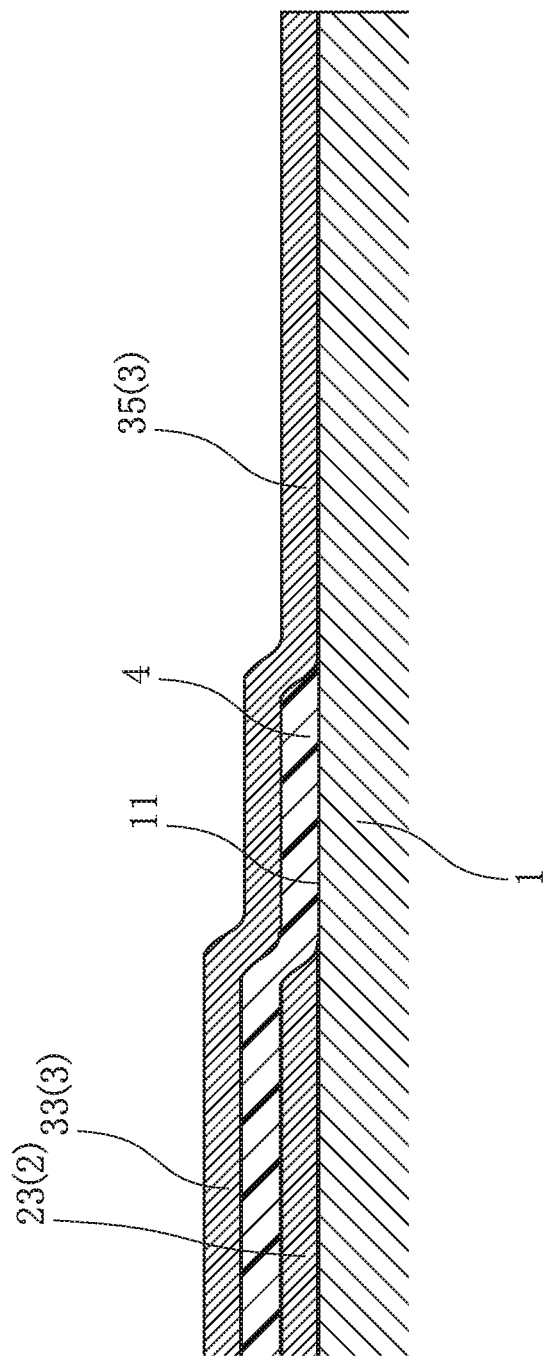
FIG. 12 is a sectional view taken along line XII-XII of FIG. 2.
Figure 13:
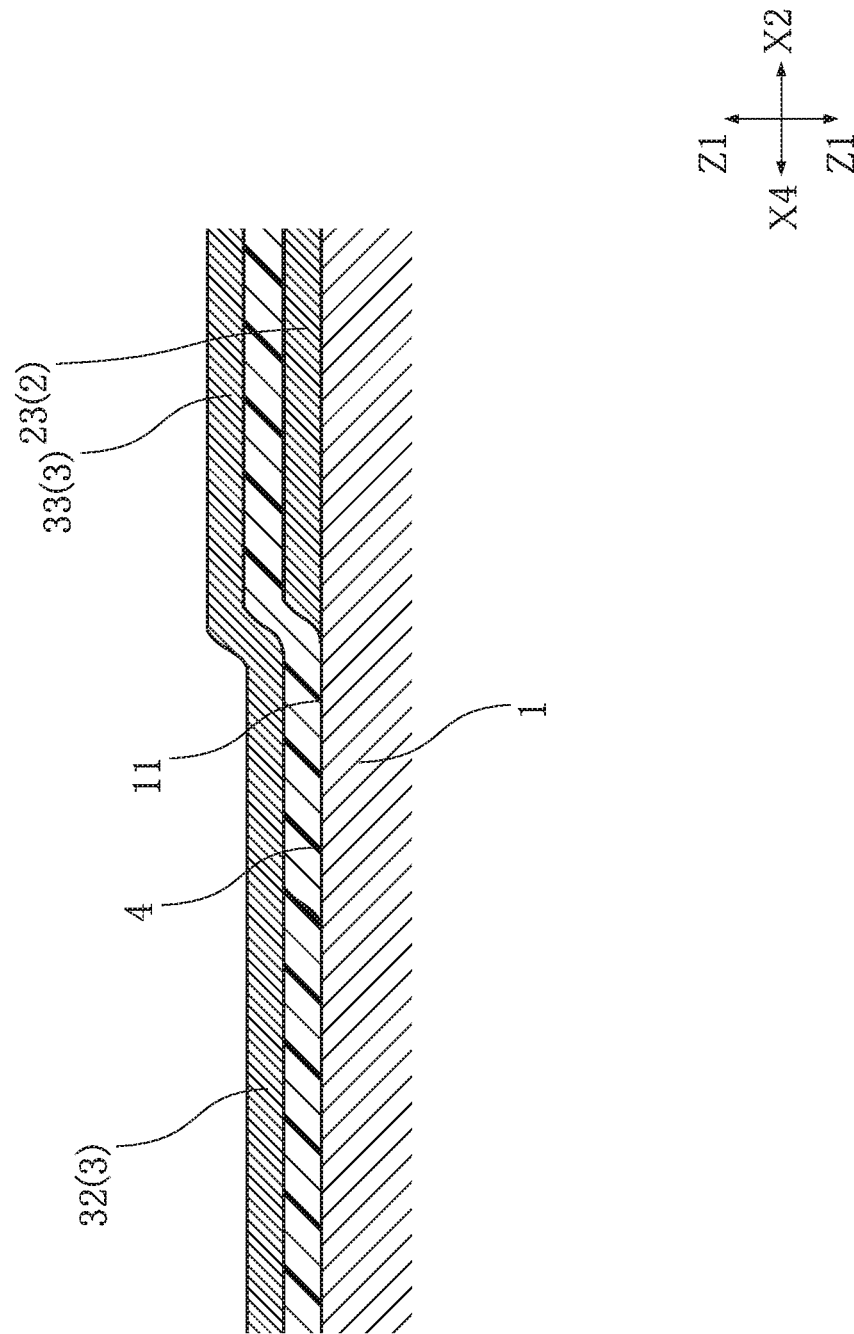
FIG. 13 is another sectional view taken along line XII-XII of FIG. 2.
Figure 14:
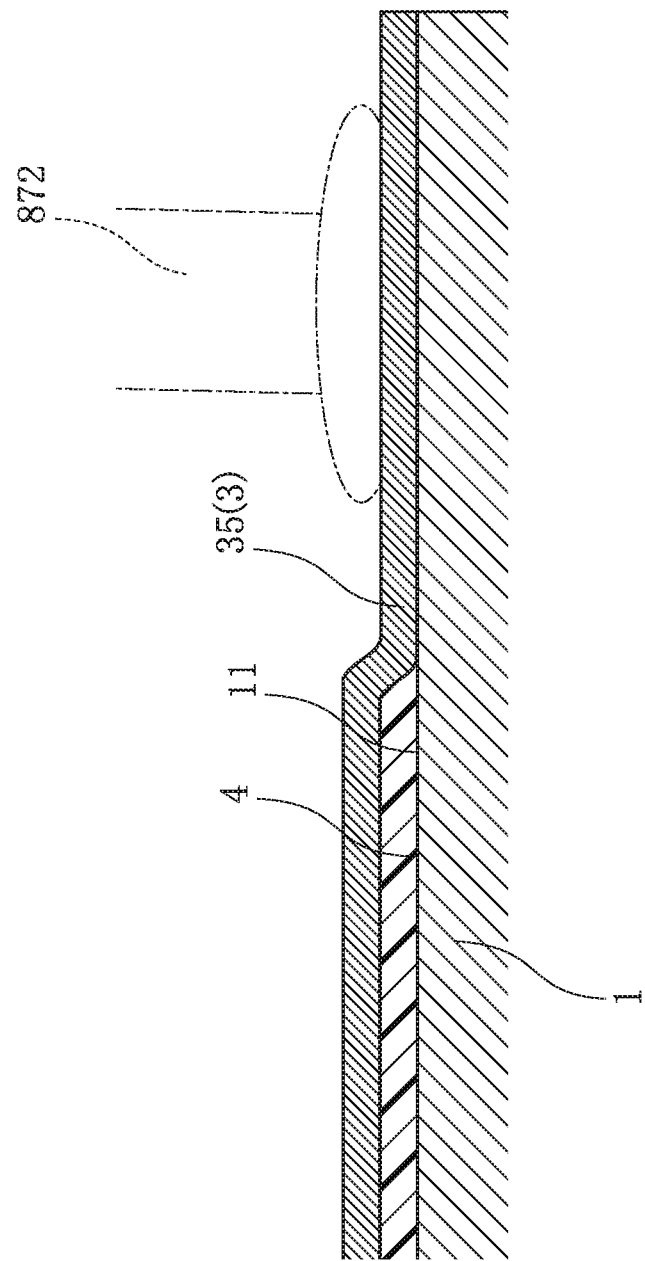
FIG. 14 is a sectional view taken along line XIV-XIV of FIG. 2.

In FIG. 3, the second capacitor portion 33 is offset from the active element 5 in the second direction X2. As shown in FIGS. 12 and 13, the first capacitor portion 23 is located between the second capacitor portion 33 and the semiconductor substrate 1. Unlike the present embodiment, the second capacitor portion 33 may be located between the first capacitor portion 23 and the semiconductor substrate 1. The second capacitor portion 33 is disposed above the first capacitor portion 23 and electrically insulated from the first capacitor portion 23 by the insulating layer 4. The second capacitor portion 33 and the first capacitor portion 23 may form a capacitor. In the present embodiment, the second capacitor portion 33 is rectangular as viewed in the thickness direction Z1.

Figure 11:
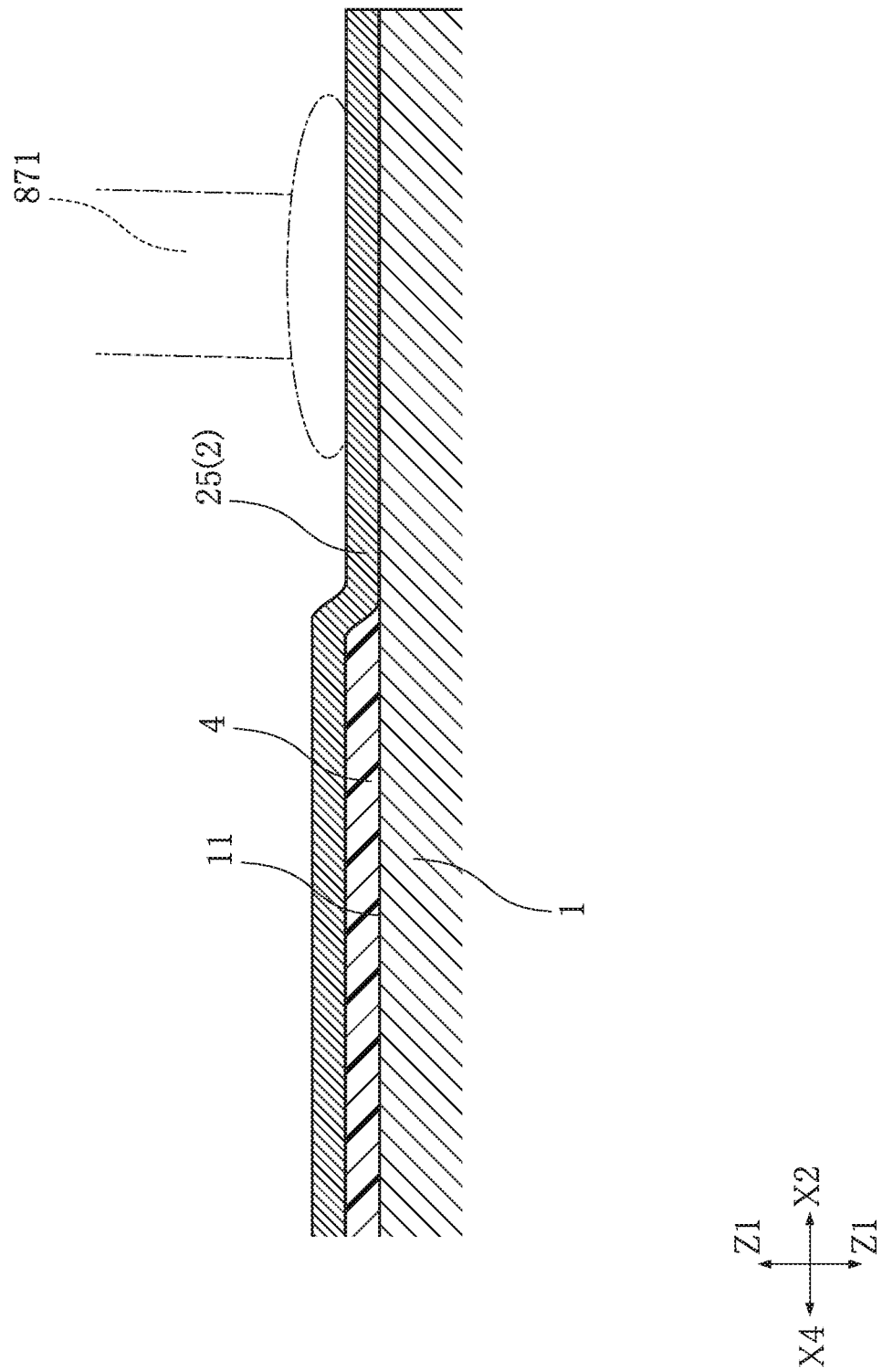
FIG. 11 is a sectional view taken along line XI-XI of FIG. 2.

The first electrode 25 is physically connected to the first capacitor portion 23. In the present embodiment, the first electrode 25 is rectangular. In the present embodiment, the first electrode 25 comprises a pad portion to which a wire 871 is bonded (see FIG. 11). As shown in FIG. 11, the first electrode 25 has a portion directly in contact with the semiconductor substrate 1. As viewed in the thickness direction Z1, the contact portion includes a wire bonding portion where the wire 871 contacts the first electrode 25.

As shown in FIG. 2, the first electrode 25 of this embodiment has edges 251 to 254 as viewed in the thickness direction Z1. The edges 251 and 253 extend in the second direction X2. The edges 252 and 254 are spaced apart from each other in the second direction X2. The edges 252 and 254 extend in the first direction X1. The edge 251 is physically connected to the edge 252, the edge 252 is physically connected to the edge 253, the edge 253 is not connected to but separated from the edge 254, and the edge 254 is physically connected to the edge 251. As viewed in the thickness direction Z1, the edges 251 and 252 respectively overlap with the edges 131 and 132. Unlike the present embodiment, the edges 251 and 252 may be located inward of the edges 131 or 132 as viewed in the thickness direction Z1.

The second electrode 35 is physically connected to the second capacitor portion 33. In the present embodiment, the second electrode 35 is rectangular. In the present embodiment, the second electrode 35 comprises a pad portion to which a wire 872 is bonded (see FIG. 14). As shown in FIG. 12, the second electrode 35 has a portion directly in contact with the semiconductor substrate 1. As viewed in the thickness direction Z1, the contact portion includes a wire bonding portion where the wire 872 contacts the second electrode 35.

In this embodiment, the second electrode 35 reaches the edges 133 and 132 as shown in FIG. 2 viewed in the thickness direction Z1. Unlike the present embodiment, the second electrode 35 may terminate before reaching the edges 133 and 132 as viewed in the thickness direction Z1. In the manufacture of the terahertz-wave detector B1, this configuration allows the semiconductor substrate 1 to be diced without cutting the second electrode 35, so that bar formation can be reduced.

In this embodiment, the second electrode 35 of has edges 351 to 354 as shown in FIG. 2 viewed in the thickness direction Z1. The edges 351 and 353 extend in the second direction X2. The edges 352 and 354 are spaced apart from each other in the second direction X2. The edges 352 and 354 extend in the first direction X1. The edge 351 is physically connected to the edge 352, the edge 352 is physically connected to the edge 353, the edge 353 is physically connected to the edge 354, and the edge 354 is not connected to the edge 351. As viewed in the thickness direction Z1, the edges 352 and 353 respectively overlap with the edges 132 and 133. Unlike the present embodiment, the edges 352 and 353 maybe located inward of the edges 132 and 133 as viewed in the thickness direction Z1.

Figure 15:
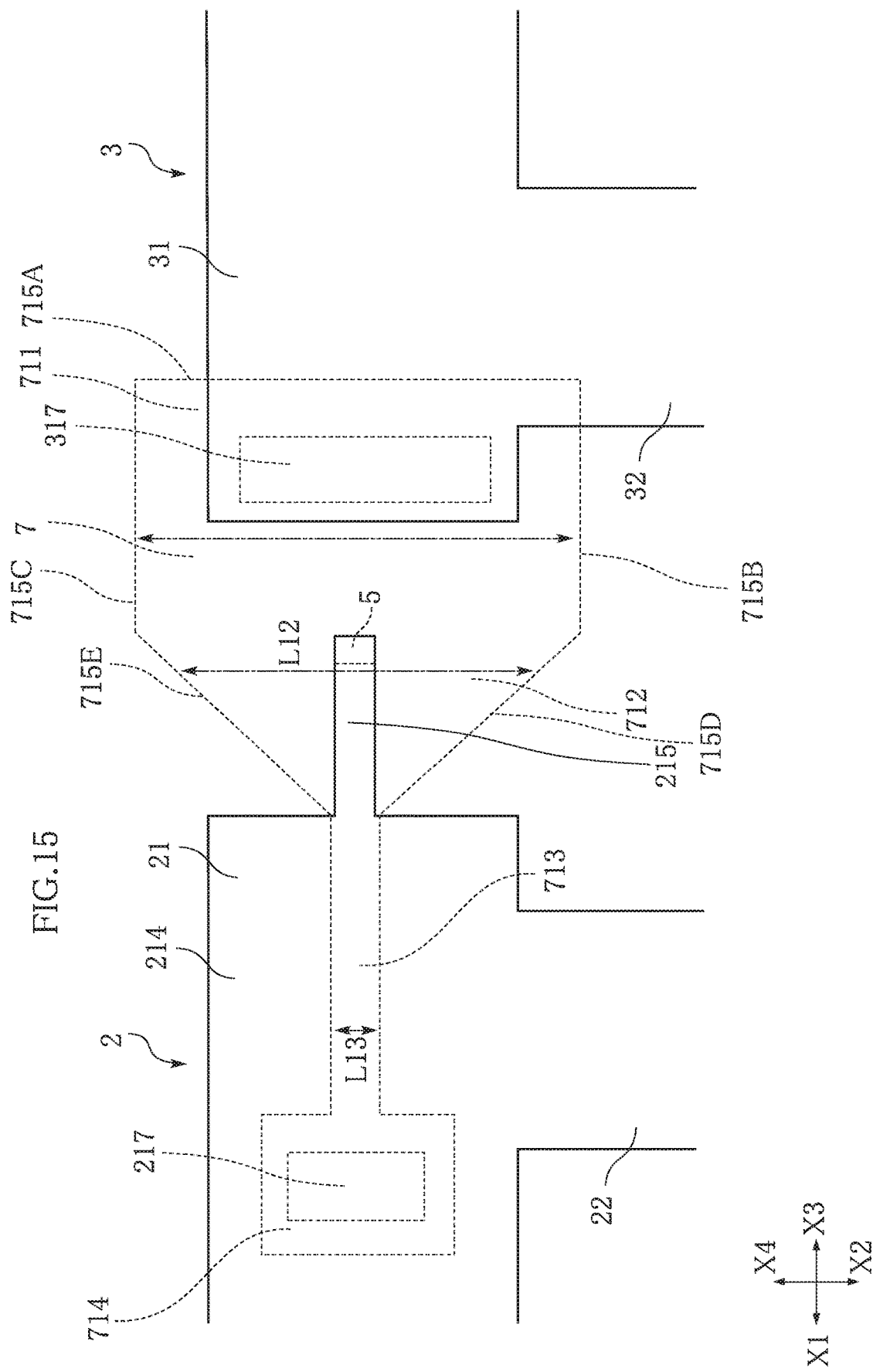
FIG. 15 is a partially enlarged view of FIG. 4.

FIG. 15 is a partially enlarged view of FIG. 4.

As shown in FIG. 15, the resistive layer 7 overlaps with the first conductive portion 214, the second conductive portion 215 and the second conductive layer 3 as viewed in the thickness direction Z1 of the semiconductor substrate 1. As shown in FIG. 5, the resistive layer 7 of this embodiment includes a first resistive portion 71 and a second resistive portion 72. The first resistive portion 71 and the second resistive portion 72 are physically connected to each other. Although FIG. 5 shows a chain double-dashed line representing the boundary between the first resistive portion 71 and the second resistive portion 72, this chain double-dashed line does not necessarily indicate the presence of a visible boundary.

Figure 17A:
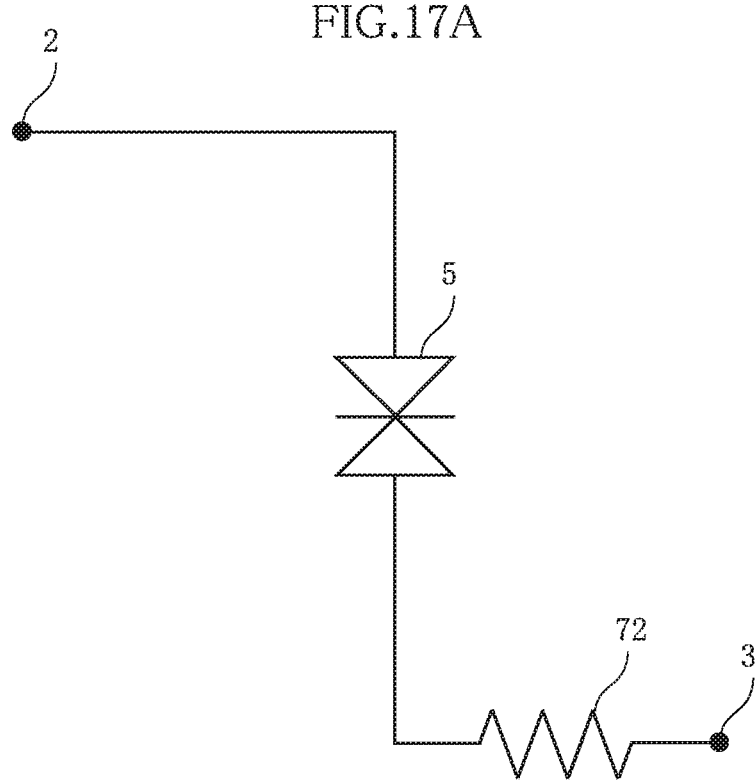
FIG. 17A is a circuit diagram of a part of a conventional terahertz-wave detector.
Figure 17B:
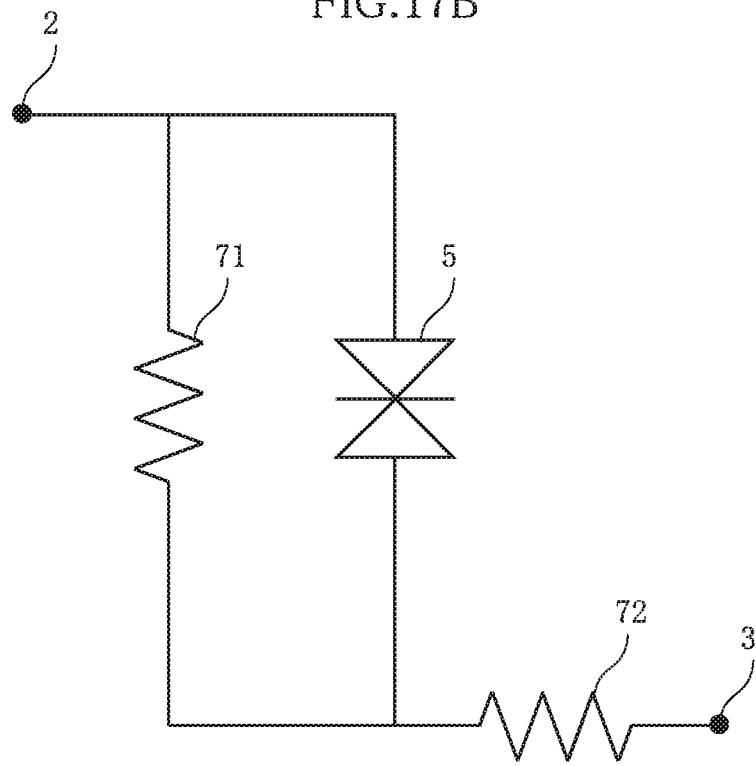
FIG. 17B is a circuit diagram of a part of the terahertz-wave detector according to the first embodiment.

FIG. 17B is a circuit diagram of a portion of the terahertz-wave detector according to the first embodiment.

As shown in FIG. 17B, the first resistive portion 71 is electrically connected in parallel with the active element 5. Each of the active element 5 and the first resistive portion 71 is electrically connected between the first conductive layer 2 and the second conductive layer 3. The first resistive portion 71 may have a resistance of, for example, 10 to 40Ω, and more preferably a resistance of 25 to 35Ω. As shown in FIG. 5, the first resistive portion 71 is in contact with the first contact portion 217 of the first conductive layer 2.

As shown in FIG. 17B, the second resistive portion 72 is electrically connected in series with the active element 5. As shown in FIGS. 5 and 15, the second resistive portion 72 overlaps with the second conductive layer 3 as viewed in the thickness direction Z1. As shown in FIG. 5, the second resistive portion 72 is in contact with the second contact portion 317 of the second conductive layer 3. The second resistive portion 72 may have a resistance of 0 to 5Ω, for example.

As shown in FIG. 15, the resistive layer 7 has portions 711 to 714.

The portion 711 overlaps with the second conductive layer 3 as viewed in the thickness direction Z1. The portion 711 has edges 715A to 715C. The edge 715A extends in the second direction X2. The edges 715B and 715C are opposite to each other in the second direction X2. The edges 715B and 715C are physically connected to the edge 715A and extend in the first direction X1.

The portion 712 is offset from the portion 711 in the first direction X1. The portion 712 is physically connected to the portion 711. In the present embodiment, the portion 712 overlaps with the active element 5 as viewed in the thickness direction Z1. In the example shown in FIG. 15, the dimension L12 of the portion 712 in the second direction X2 becomes smaller as proceeding in the first direction X1. The portion 712 has edges 715D and 715E. The edges 715D and 715E are opposite to each other in the second direction X2. As viewed in the thickness direction Z1, the edges 715D and 715E are inclined relative to both the first direction X1 and the second direction X2.

The portion 713 is offset from the portion 712 in the first direction X1. The portion 713 is physically connected to the portion 712. The portion 713 extends in the first direction X1. The dimension L13 of the portion 713 in the second direction X2 is preferably shorter than the dimension L11 of the portion 711 in the second direction X2.

The portion 714 is offset from the portion 713 in the first direction X1. The portion 714 is physically connected to the portion 713. The portion 714 is in contact with the first contact portion 217 of the first conductive layer 2.

As shown in FIG. 16, the terahertz-wave detector B1 and a terahertz oscillator 81 can together form a terahertz unit C1. The terahertz oscillator 81 is similar to the terahertz-wave detector B1 except that the first resistive portion 71 is not provided. The terahertz oscillator 81 generates terahertz waves and the terahertz-wave detector B1 detects terahertz waves transmitted through a target object (not shown).

Figure 18A:
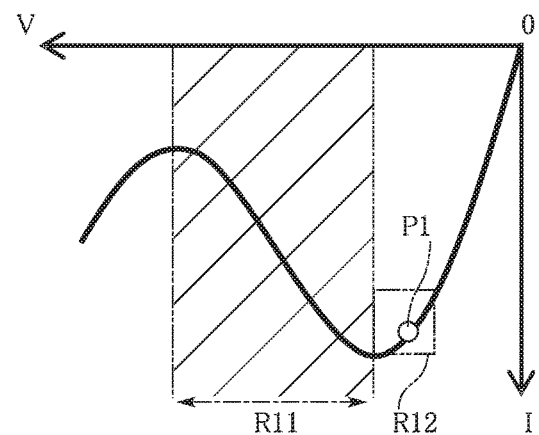
FIG. 18A is a graph showing the current-voltage characteristics of a conventional terahertz-wave detector.
Figure 18B:
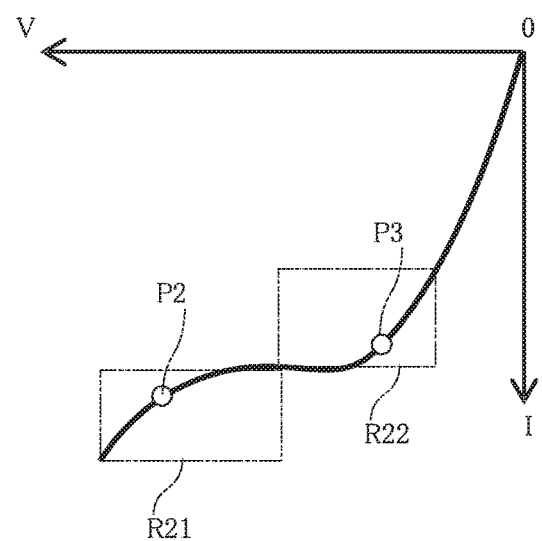
FIG. 18B is a graph showing the current-voltage characteristics of the terahertz-wave detector according to the first embodiment.
Figure 19A:
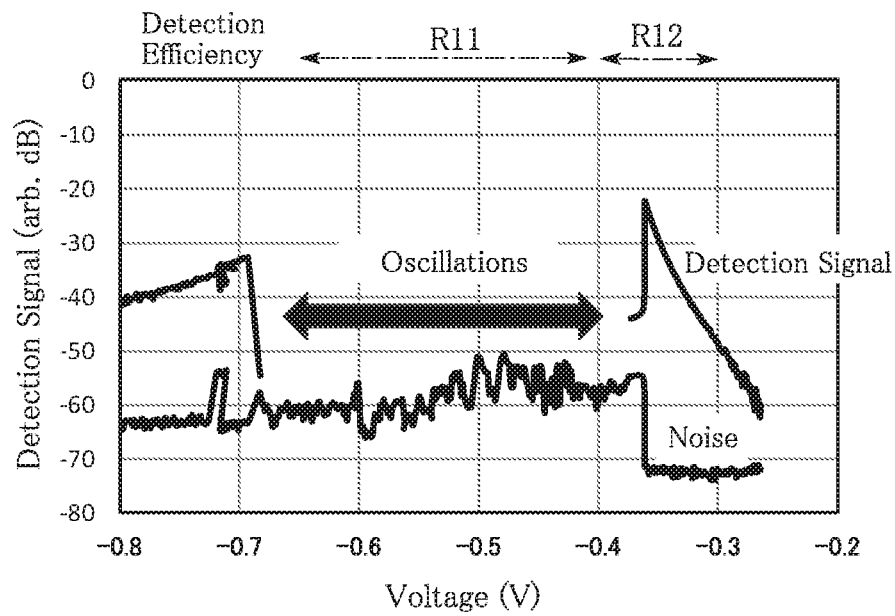
FIG. 19A is a graph showing the noise and detection efficiency relative to voltage for a conventional terahertz-wave detector.

FIG. 17A shows a portion of a circuit of a conventional terahertz-wave detector (a terahertz-wave detector not having a first resistive portion 71). In the present disclosure, the active element 5 has a negative resistance property (a property that shows a current-voltage characteristic curve having a negative slope). Thus, as shown in FIG. 18A, the current-voltage characteristic curve of the conventional terahertz-wave detector has a region R11 in which the slope is negative. As shown in FIGS. 18A and 19A, the region R11 is where the terahertz-wave detector generates terahertz waves. Furthermore, noise in the region R11 is greater than noise in the region R12 as shown in FIG. 19A. Thus, as shown in FIG. 18A, the operating point for terahertz detection is often set at the point P1 where the voltage is slightly higher than the upper limit voltage of the region R11. In the example shown in FIG. 18A, the region R12 is an operating region for terahertz detection.

Figure 19B:
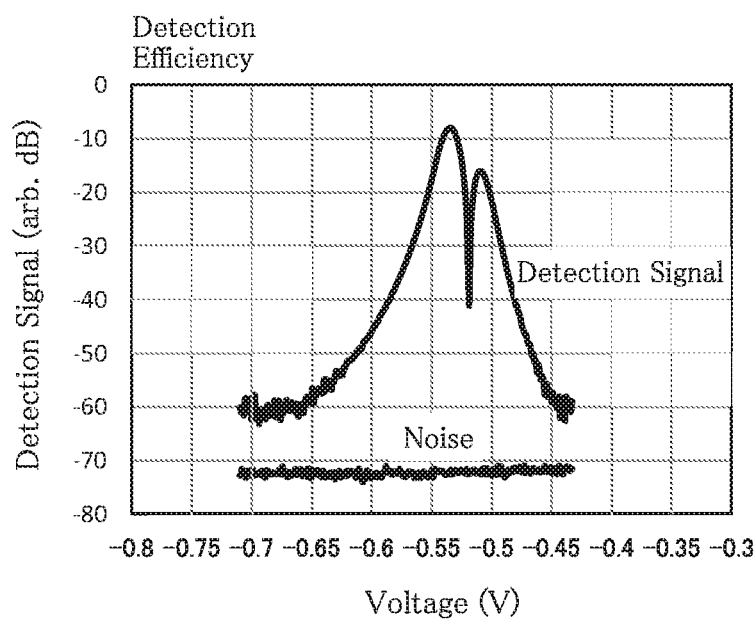
FIG. 19B is a graph showing the noise and detection efficiency relative to voltage for the terahertz-wave detector according to the first embodiment.

FIG. 17B shows the present embodiment in which the first resistive portion 71 is electrically connected in parallel with the active element 5. With this configuration, oscillations of the terahertz-wave detector B1 are reduced or prevented. For example, the current-voltage characteristic curve shown in FIG. 18B has a zero or positive slope in any voltage range shown therein. In addition, as shown in FIG. 19B, noise is lower than the noise shown in the region R11 of FIG. 19A for any voltage value. This allows the points P2 and P3 shown in FIG. 18B to be set as the operation points. In the example shown in FIG. 18B, the regions R21 and R22 are operating ranges for detecting terahertz waves.

As has been described above, the present embodiment provides the terahertz-wave detector B1 configured to reduce or prevent terahertz wave oscillations and also to reduce the dependence of the detection efficiency on bias voltage.

According to the present embodiment, the first resistive portion 71 may have a resistance of 10 to 40Ω, for example. For example, if the resistance is less than 10Ω, the first resistive portion 71 will not contribute to detection of terahertz waves and consume more current. This can reduce the power efficiency and induce loss of detection signals. Thus, the resistance should not be lower than a certain level, and typically not less than 10Ω for terahertz RTD. On the other hand, if the portion 711 has a resistance greater than 40Ω, such configuration lessens the ability to reduce or prevent oscillations and subsequent generation terahertz waves. In view of the above, the first resistive portion 71 preferably has a resistance falling within the range specified above.

According to the present embodiment, the resistive layer 7 passes electric current in a direction from the portion 711 to the portion 714 or from the portion 714 to the portion 711. According to the present embodiment, the portion 712 have the edges 715D and 715E inclined relative to both the first direction X1 and the second direction X2 as viewed in the thickness direction Z1. That is, the resistive layer 7 is configured so as avoid forming corners at 90° or 270° angles as much as possible. This configuration can reduce adverse influence on detection of terahertz waves, which are high-frequency waves generated by the terahertz unit C1.

In the present embodiment, the portion 713 extends in the first direction X1 as shown in FIG. 15. The dimension L13 of the portion 713 in the second direction X2 is shorter than the dimension L11 of the portion 711 in the second direction X2. This configuration allows the third portion 713 to have a sufficient resistance without excessively extending the length of the portion 713 in the first direction X1. Thus, the resistive layer 7 can be configured to have a desired resistance, without increasing the inductance of the resistive layer 7.

According to the present embodiment, the resistive layer 7 forms the first resistive portion 71 and the second resistive portion 72. The second resistive portion 72 is physically connected to the first resistive portion 71. With this configuration, the first resistive portion 71 and the second resistive portion 72 can be formed at the same time by forming the resistive layer 7. This improves the efficiency of manufacturing the terahertz-wave detector B1.

<Variations>

With reference to FIGS. 20 to 23, variations of the present disclosure are described.

Figure 20:
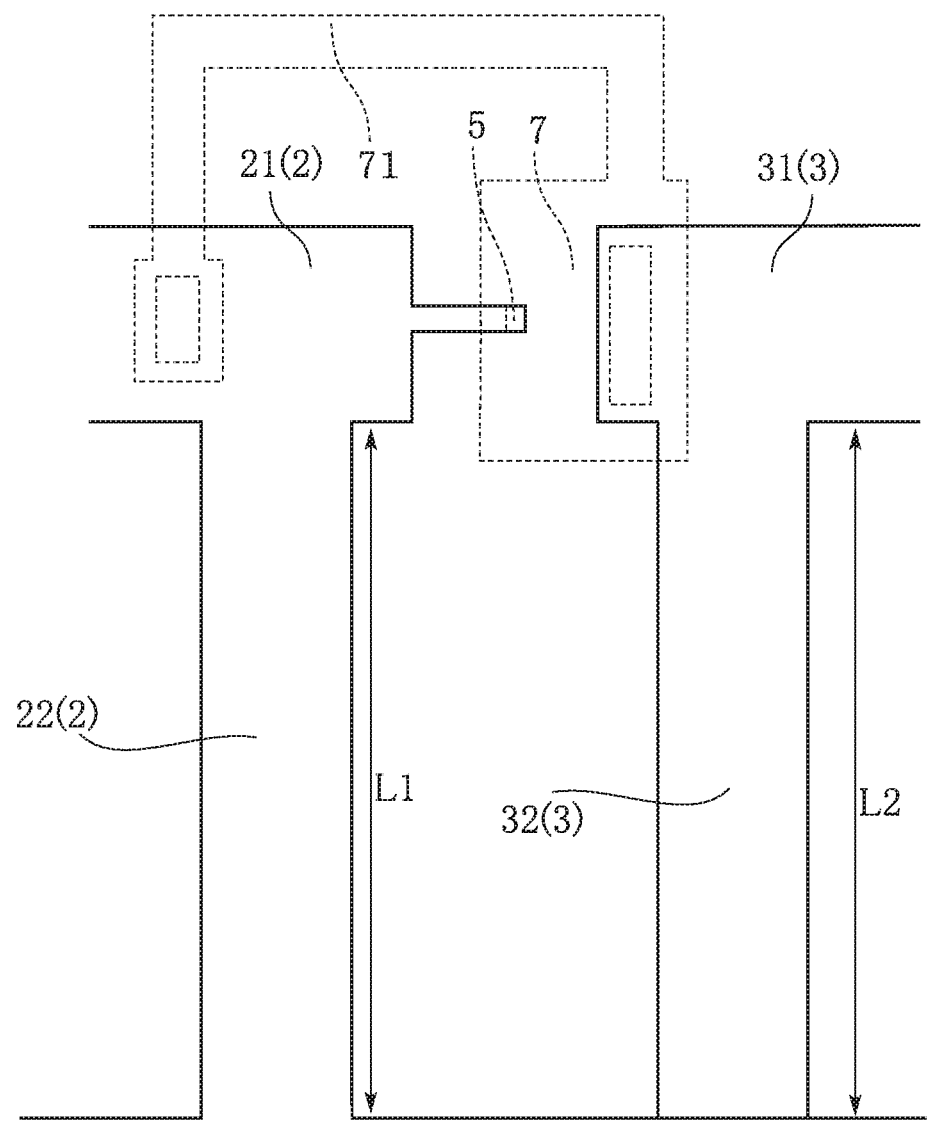
FIG. 20 is a plan view of a terahertz-wave detector according to a first variation of the first embodiment.

The terahertz-wave detector shown in FIG. 20 differs from the terahertz-wave detector B1 shown in FIG. 4 in that the first resistive portion 71 is offset upward from the first conductive layer 2 and the second conductive layer 3 in the figure. This configuration can similarly reduce or prevent terahertz wave oscillations and also to reduce the dependence of the detection efficiency on bias voltage.

Figure 21:
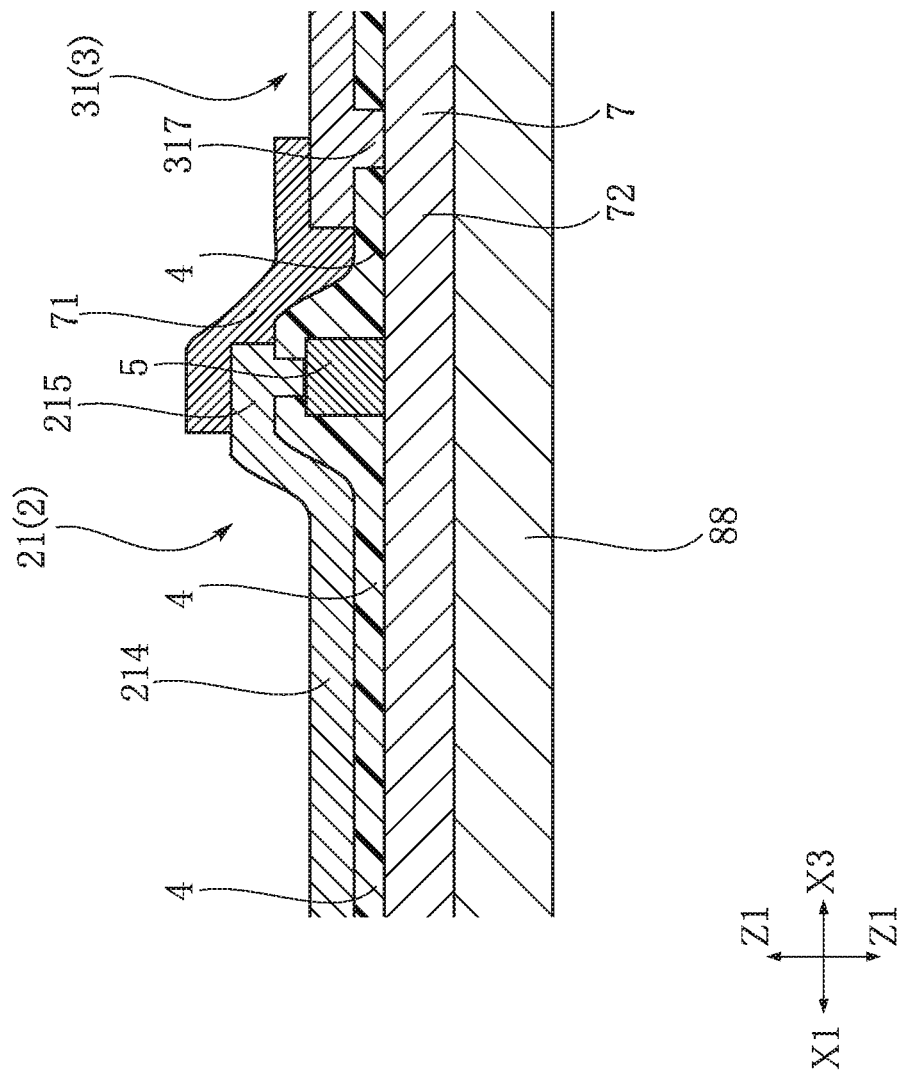
FIG. 21 is a sectional view of a terahertz-wave detector according to a second variation of the first embodiment.
Figure 22:
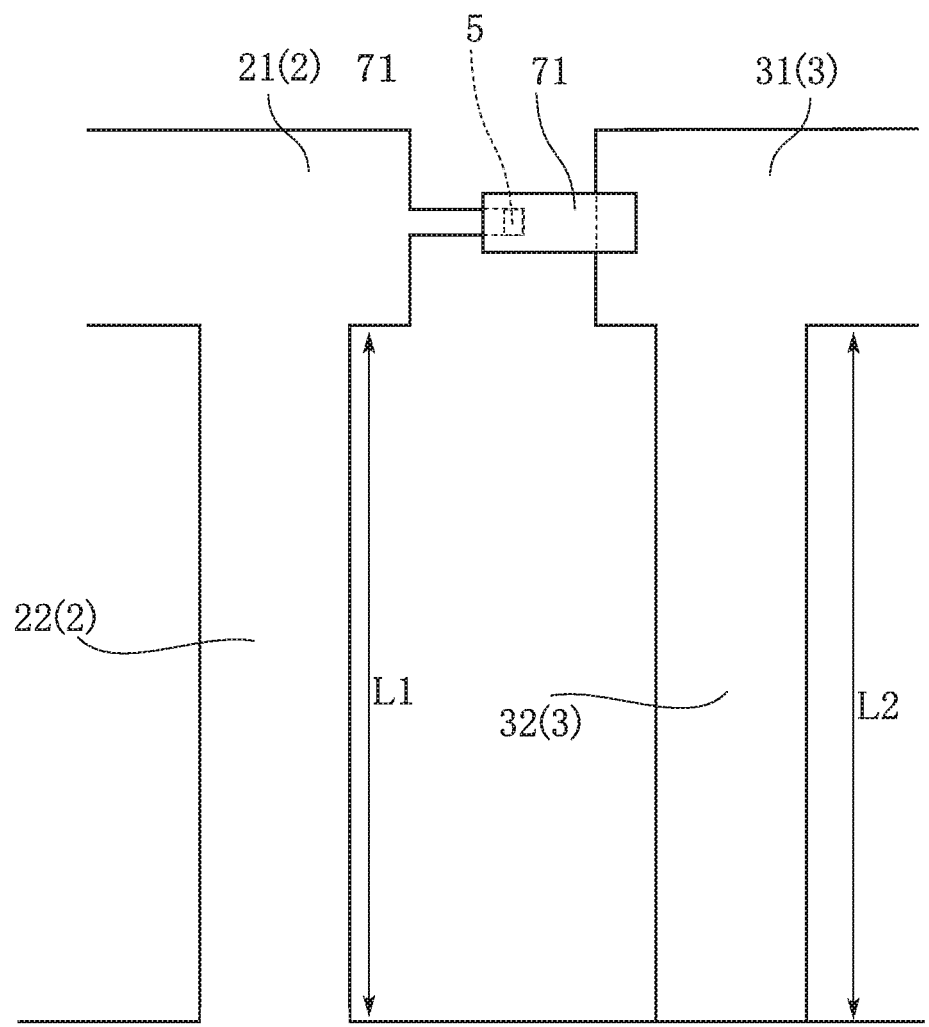
FIG. 22 is a plan view of the terahertz-wave detector according to the second variation of the first embodiment.

The terahertz-wave detector shown in FIGS. 21 and 22 differs from the terahertz-wave detector B1 shown in FIG. 4 in that the first resistive portion 71 is formed on the first conductive layer 2 and the second conductive layer 3. In this variation, the first resistive portion 71 may be made of Ni or polysilicon. The first resistive portion 71 extends in the first direction X1. This configuration can similarly reduce or prevent terahertz wave oscillations and also to reduce the dependence of the detection efficiency on bias voltage.

The terahertz-wave detector shown in FIG. 23 differs from the terahertz-wave detector shown in FIG. 22 in that the first resistive portion 71 is located above the first conductive layer 2 and the second conductive layer 3 as seen in FIG. 23. This configuration can similarly reduce or prevent terahertz wave oscillations and also to reduce the dependence of the detection efficiency on bias voltage.

Unless specifically noted otherwise, the phrases "object A is formed on object B" and "object A is formed above object B" used in the present disclosure intend to cover that "object A is formed in direct contact with object B" and "object A is formed above object B, with another object interposed therebetween". Similarly, unless specifically noted otherwise, the phrases "object A is disposed on object B" and "object A is disposed above object B" intend to cover that "object A is disposed in direct contact with object B" and "object A is disposed above object B, with another object interposed therebetween". Similarly, unless specifically noted otherwise, the phrases "object A is located on object B" intends to cover that "object A is located in direct contact with object B" and "object A is located above object B, with another object interposed therebetween". Similarly, unless specifically noted otherwise, the phrases "object A is stacked on object B" and "object A is stacked above object B" intend to cover that the scope "object A is stacked in direct contact with object B" and "object A is stacked above object B, with another object interposed therebetween"

The present disclosure is not limited to the embodiments described above. The present disclosure may be changed in various forms as to the specific configurations of various parts.

The present disclosure include the clauses listed below.

[Clause 1]
A terahertz-wave detector comprising:
a semiconductor substrate;
an active element formed on the semiconductor substrate; and
a first resistive portion electrically connected in parallel with the active element.

[Clause 2]
The terahertz-wave detector according to clause 1, further comprising a first conductive layer and a second conductive layer formed on the semiconductor substrate and electrically insulated from each other, wherein
the active element and the first resistive portion are electrically located between the first conductive layer and the second conductive layer.

[Clause 3]
The terahertz-wave detector according to clause 1 or 2, wherein the active element has a negative resistance property.

[Clause 4]
The terahertz-wave detector according to any one of clauses 1 to 3, wherein the first resistive portion has a resistance of 10 to 40Ω.

[Clause 5]
The terahertz-wave detector according to any one of clauses 1 to 4, further comprising a resistive layer formed on the semiconductor substrate, wherein the resistive layer comprises the first resistive portion.

[Clause 6]
The terahertz-wave detector according to clause 2, wherein the resistive layer is physically located between the active element and the semiconductor substrate.

[Clause 7]
The terahertz-wave detector according to any one of clauses 1 to 6, wherein the resistive layer overlaps with the active element as viewed in a thickness direction of the substrate.

[Clause 8]
The terahertz-wave detector according to clause 5, wherein the first conductive layer includes a first conductive portion and a second conductive portion that extends from the second conductive portion toward the second conductive layer as viewed in a thickness direction of the semiconductor substrate, and
the resistive layer overlaps with the first conductive portion, the second conductive portion and the second conductive layer as viewed in the thickness direction of the semiconductor substrate.

[Clause 9]
The terahertz-wave detector according to clause 8, wherein the resistive layer overlaps with an entirety of the second conductive portion as viewed in the thickness direction of the substrate.

[Clause 10]
The terahertz-wave detector according to clause 8 or 9, wherein
as viewed in the thickness direction of the semiconductor substrate, the active element is spaced apart from the second conductive layer in a first direction perpendicular to the thickness direction of the semiconductor substrate,
the resistive layer includes a first portion and a second portion,
the first portion overlaps with the second conductive layer as viewed in the thickness direction,
the second portion is offset from the first portion in the first direction, and
a dimension of the second portion measured in a second direction perpendicular to the thickness direction and the first direction becomes smaller as proceeding in the first direction.

[Clause 11]
The terahertz-wave detector according to clause 10, wherein
the second portion of the resistive layer has two edges opposite to each other in the second direction, and
each of the two edges are inclined relative to both of the first direction and the second direction.

[Clause 12]
The terahertz-wave detector according to clause 10 or 11, wherein
the resistive layer includes a third portion extending in the first direction, wherein a dimension of the third portion measured in the second direction is smaller than the dimension of the first portion measured in the second direction.

[Clause 13]
The terahertz-wave detector according to clause 12, wherein the resistive layer includes a fourth portion in contact with the first conductive layer.

[Clause 14]
The terahertz-wave detector according to any one of clauses 1 to 13, further comprising a second resistive portion electrically connected in series with the active element, and
wherein the resistive layer comprises the second resistive portion, and the second resistive portion is physically connected to the first resistive portion.

[Clause 15]
A terahertz system comprising:
a terahertz-wave oscillator that generates terahertz waves; and
a terahertz-wave detector according to clause 1,
wherein the terahertz-wave detector detects terahertz waves generated by the terahertz oscillator.

The invention claimed is:
1. A terahertz-wave detector comprising:
a semiconductor substrate;
an active element formed on the semiconductor substrate;
a first resistive portion electrically connected in parallel with the active element; and
a first conductive layer and a second conductive layer formed on the semiconductor substrate and electrically insulated from each other, wherein
the active element and the first resistive portion are electrically located between the first conductive layer and the second conductive layer, and the first conductive layer includes
a first conductive portion, and
a second conductive portion that extends from the first conductive portion toward the second conductive layer as viewed in a thickness direction of the semiconductor substrate.

2. The terahertz-wave detector according to claim 1, wherein the active element has a negative resistance property.

3. The terahertz-wave detector according to claim 1, wherein the first resistive portion has a resistance of 10 to 40Ω.

4. The terahertz-wave detector according to claim 1, further comprising a resistive layer formed on the semiconductor substrate, wherein the resistive layer comprises the first resistive portion.

5. The terahertz-wave detector according to claim 4, wherein the resistive layer is physically located between the active element and the semiconductor substrate.

6. The terahertz-wave detector according to claim 4, wherein the resistive layer overlaps with the active element as viewed in the thickness direction of the semiconductor substrate.

7. The terahertz-wave detector according to claim 4, wherein
the resistive layer overlaps with the first conductive portion, the second conductive portion and the second conductive layer as viewed in the thickness direction of the semiconductor substrate.

8. The terahertz-wave detector according to claim 7, wherein the resistive layer overlaps with an entirety of the second conductive portion as viewed in the thickness direction of the semiconductor substrate.

9. The terahertz-wave detector according to claim 7, wherein
as viewed in the thickness direction of the semiconductor substrate, the active element is spaced apart from the second conductive layer in a first direction perpendicular to the thickness direction of the semiconductor substrate,
the resistive layer includes a first portion and a second portion,
the first portion overlaps with the second conductive layer as viewed in the thickness direction,
the second portion is offset from the first portion in the first direction, and
a dimension of the second portion measured in a second direction perpendicular to the thickness direction and the first direction is smaller as the second portion extends in the first direction.

10. The terahertz-wave detector according to claim 9, wherein
the second portion of the resistive layer has two edges opposite to each other in the second direction, and
each of the two edges are inclined relative to both of the first direction and the second direction.

11. The terahertz-wave detector according to claim 9, wherein
the resistive layer includes a third portion extending in the first direction, wherein a dimension of the third portion measured in the second direction is smaller than the dimension of the first portion measured in the second direction.

12. The terahertz-wave detector according to claim 11, wherein the resistive layer includes a fourth portion in contact with the first conductive layer.

13. The terahertz-wave detector according to claim 4, further comprising a second resistive portion electrically connected in series with the active element, and
wherein the resistive layer comprises the second resistive portion, and the second resistive portion is physically connected to the first resistive portion.

14. A terahertz system comprising:
a terahertz-wave oscillator that generates terahertz waves; and
a terahertz-wave detector according to claim 1,
wherein the terahertz-wave detector detects terahertz waves generated by the terahertz-wave oscillator.

* * * * *